United States Patent [19]

Ichimura

[11] 4,444,868

[45] Apr. 24, 1984

[54] PHOTOSENSITIVE COMPOSITION

[75] Inventor: Kunihiro Ichimura, Yatabemachi, Japan

[73] Assignees: Agency of Industrial Science & Technology; Ministry of International Trade & Industry, both of Tokyo, Japan

[21] Appl. No.: 404,719

[22] Filed: Aug. 3, 1982

[30] Foreign Application Priority Data

Aug. 6, 1981 [JP] Japan .................................. 56-123231
Aug. 6, 1981 [JP] Japan .................................. 56-123232

[51] Int. Cl.$^3$ ........................ G03C 1/72; C08F 299/00
[52] U.S. Cl. .................................... 430/285; 430/287; 204/159.22; 204/159.14; 525/327.1
[58] Field of Search ............... 430/286, 282, 270, 287, 430/285; 204/159.22, 159.14; 526/265, 263, 259, 257, 258; 525/326.8, 326.7, 327.1

[56] References Cited

U.S. PATENT DOCUMENTS

T888,007  7/1971  Tuites et al. ...................... 430/287
3,912,697 10/1975  Pacifici ............................ 526/257 X

FOREIGN PATENT DOCUMENTS 565761 of 0000 Japan .
5611906 of 0000 Japan .

OTHER PUBLICATIONS

Journal of Polymer Science: Part A, vol. 2, pp. 2907–2916, (1964), "Some Aspects of Photosensitivity of Poly(Vinyl Cinnamate)", Minoru Tsuda.

*Primary Examiner*—John E. Kittle
*Assistant Examiner*—Cynthia Hamilton
*Attorney, Agent, or Firm*—Oblon, Fisher, Spivak, McClelland & Maier

[57] ABSTRACT

A photosensitive composition, comprising a photo-insolubilizable resin having a styryl type nitrogen-containing heterocyclic residue and an acid and a photosensitive high molecular compound, having high sensitivity for an extremely small photosensitive group content.

4 Claims, No Drawings

PHOTOSENSITIVE COMPOSITION

BACKGROUND OF THE INVENTION

This invention relates to a novel photo-insolubilizable composition comprising a photoinsolubilizable resin containing as a photo-crosslinking residue a styryl type nitrogen-containing heterocyclic residue in the molecular unit thereof and an acid, to a novel photosensitive high molecular compound exhibiting outstanding sensitivity for an extremely small photosensitive group content, and to a method therefor.

Photosensitive resins (photo-insolubilizable high molecular compounds) have found acceptance for actual use as materials for printing plates, as photoresists such as for photoetching and phototrimming, and as photosensitive vehicles such as for paints and printing inks. Among the photosensitive resins which have found utility in actual applications, those using azide group, cinnamoyl group, acryloyl group, etc. as photo-crosslinking residues are typical. For these resins to be sufficiently practical, such photo-crosslinking residues are required to be contained in fairly large amounts in the backbone polymers of the resins. Further, these photosensitive resins are actually put to use as combined with sensitizers. In order that polyvinyl cinnamate incorporating a cinnamoyl group and constituting itself a typical photosensitive resin may be actually used advantageously as a photosensitive resin, it is imperative that the backbone polymer of the resin should incorporate the cinnamoyl group as a photo-crosslinking residue in a large amount (M. Tsuda: J. Poly Sci. A., 2, 2904 '64). Moreover, the resin should be put to use in combination with about 10% by weight of a sensitizer.

This fact implies that such a known photosensitive resin necessitates use of a large amount of a raw material for the incorporation of a photo-crosslinking residue far more expensive than the raw materials for the resin itself and that the incorporatiion of such a large amount of photo-crosslinking residue in most cases degrades the properties inherent in the backbone polymer such as, for example, intimate adhesiveness to substrates, developing property, chemical resistance, and printability.

To overcome the disadvantages described above, photosensitive resins incorporating special photo-crosslinking residues such as, for example polyvinyl alcohol incorporating a styryl type quaternary salt residue have been suggested (Japanese Patent Publication No. SHO 56(1981)-5761 and Japanese Patent Public Disclosure SHO 56(1981)-11906).

Photosensitive resins using polyvinyl alcohols as their backbone polymers, however, have such high degrees of hydrophilicity that they suffer from the disadvantage that water or water-containing aqueous organic solvents are seldom usable as their developing liquids.

The inventor conducted a study in search for a photosensitive resin which is solubilizable in any given organic solvent and is highly sensitive for a very small photosensitive group content in its backbone polymer, and a photosensitive composition using the photosensitive resin. After the study, they have perfected this invention.

SUMMARY OF THE INVENTION

The inventor has continued a study with a view to developing a resin excelling in photosensitivity and solubility by utilizing to advantage his knowledge that styryl type quaternized nitrogen-containing heterocyclic rings possess a high photo-crosslinking property and polymers containing nonquaternized styryl type nitrogen-containing heterocyclic rings in the side chains thereof excel in solubility. This invention has resulted from the study.

The photo-insolubilizable (photosensitive) composition of this invention which contains a resin incorporating a non-quaternized styryl type nitrogen-containing heterocyclic ring in the side chain thereof comprises a photo-insolubilizable resin containing as a photo-crosslinking residue thereof a styryl type nitrogen-containing heterocyclic residue of the general formula:

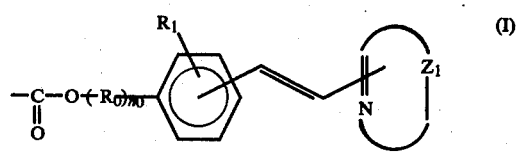

(wherein, $R_0$ denotes a divalent organic residue, $R_1$ denotes a hydrogen atom or an alkoxy group, $Z_1$ denotes an atomic group forming an aromatic heterocyclic ring and $n_0$ is 0 or 1) in an amount of at least 0.2 mol% and an organic acid or inorganic acid in an amount of 0.5 to 10 moles per mole of the aforementioned nitrogen-containing heterocyclic residue.

The high molecular compound of this invention which contains a styryl type quaternized nitrogen-containing heterocyclic ring as its photosensitive group is a photosensitive high molecular compound containing in the side chain thereof an aromatic quaternized nitrogen-containing heterocyclic residue represented by the general formula:

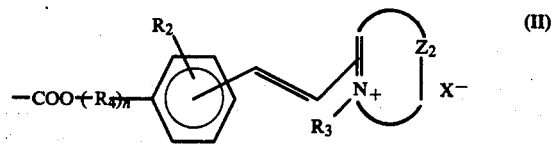

(wherein, $R_4$ denotes a divalent organic residue, $R_2$ a hydrogen atom or an alkoxy group, $R_3$ an alkyl group or aralkyl group, $X^-$ an anion of strong acid, $Z_2$ an atomic group forming an aromatic heterocyclic ring, and n is a 0 or 1).

Methods for the manufacture of this photosensitive high molecular compound are also embraced by the present invention. The first method available for the manufacture is characterized by subjecting a high molecular compound containing a formylphenyl group represented by the general formula:

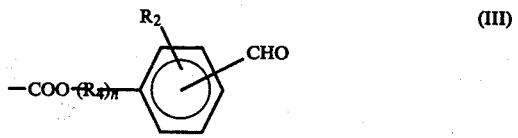

(wherein, $R_4$, $R_2$, and n have the same meanings as described above) and a methyl-substituted quaternized nitrogen-containing heterocyclic compound represented by the general formula:

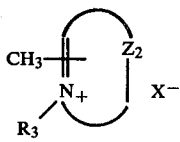
(IV)

(wherein, $R_3$, $R_2$, and $X^-$ have the same meanings as described above) to dehydration condensation. The second method is characterized by causing a high molecular compound containing in the side chain thereof a construction unit of a nitrogen-containing heterocyclic ring represented by the general formula:

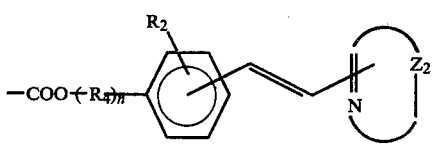
(V)

(wherein, $R_4$, $R_2$, $Z_2$, and n have the same meanings as described above) to react with a compound represented by the general formula:

$$R_3-X \qquad (VI)$$

(wherein, X denotes a strong acid residue and $R_3$ has the same meaning as described above). The third method is characterized by copolymerizing a derivative of acrylic acid or methacrylic acid represented by the general formula:

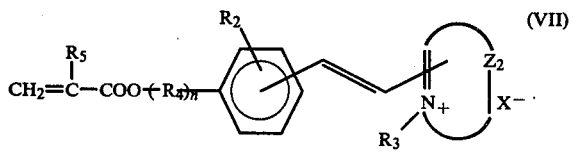
(VII)

(wherein, $R_5$ denotes a hydrogen atom or a methyl group, $R_4$, $R_2$, $R_3$, $X^-$, $Z_2$ and n have the same meanings as above) with other monomer having a vinyl polymerizing property.

DESCRIPTION OF PREFERRED EMBODIMENTS

First, the photo-insolubilizable (photosensitive) composition which comprises a photo-insolubilizable resin containing an aromatic heterocyclic group represented by the general formula (I):

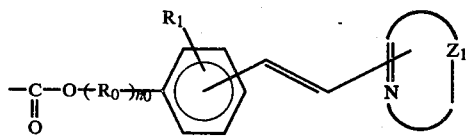

in the molecular unit thereof and an inorganic acid or organic acid will be described.

Examples of the aromatic heterocyclic ring,

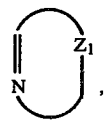

included in the foregoing general formula are as follows:

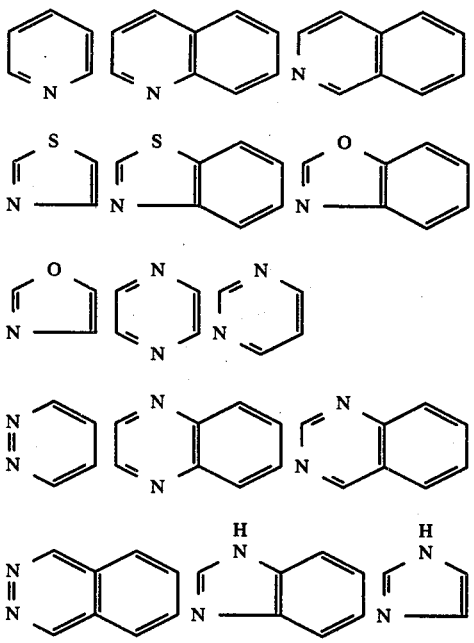

Optionally, these rings may have undergone nuclear substitution with an alkyl group, alkoxy group, or hydroxyl group. Although the backbone polymer in which the group represented by the general formula (I) is incorporated is not specifically limited, examples of the backbone polymer advantageously usable herein are hydrolyzates or homopolymer and copolymers of vinyl acetate, homopolymer and copolymers of olefins, and homopolymers and copolymers of acrylic acid and methacrylic acids.

It is also imperative that the photo-insolubilizable resin to be used in the present invention should incorporate therein at least 0.2 mol% of the photo-crosslinking residue of the aforementioned general formula (I). If the content of the residue is less than 0.2 mol%, then a photo-insolubilizable resin composition is no longer obtained. If the content of the residue is excessively high, the advantageous properties of the resin are adversely affected and the cost of raw materials is notably increased. Practically, therefore, the upper limit of the residue content is about 10 mol%.

The photo-insolubilizable resin proves to be practical when it has a molecular weight in the range of 2,000 to 1,000,000. If the molecular weight is less than 2,000, there is a disadvantage that the irradiation required for insolubilization of the resin must be continued for a very long time. If the molecular weight exceeds 1,000,000, the viscosity of the resin is too high for the resin to be handled with ease. Preferably, this molecular weight is desired to be in the range of 10,000 to 600,000.

The basicity of the nitrogen-containing heterocyclic ring included in the structure of the general formula (I) is generally in the range of 0.6 to 7 in pKa, although it is slightly variable with the particular kind of the ring.

Generally, the composition of the present invention is produced by dissolving the photo-insolubilizable resin in a solvent and adding the acid to the resultant solution. Even if the ratio of the photo-crosslinking residue incorporated in the resin is less than 1 mol%, the composition produced as described above is far more sensitive than the photosensitive materials of the common run heretofore marketed and put to use.

The composition of the present invention is produced by adding to a resin which has incorporated into the backbone polymer thereof a styryl type nitrogen-containing heterocyclic residue of the aforementioned general formula (I) in a proportion of at least 0.2 mol% either an organic acid or inorganic acid in an amount of 0.5 to 10 moles per mole of the nitrogen-containing heterocyclic ring contained in the aforementioned resin. If the amount of the acid thus added is less than 0.5 mole, the improvement in the sensitivity aimed at by the addition is not sufficiently obtained. If the amount exceeds 10 moles, the effect in obtaining the improvement in the sensitivity is rather lowered than heightened and the properties of the resin are adversely affected. Preferably, the amount of the acid to be added is in the range of 1 to 5 moles. The discovery that a resin whose original photosensitivity is much lower than the photosensitivity of the commercially available photosensitive material is caused by the addition of the acid to acquire much higher photosensitivity than the photosensitivity of the commercially available material was beyond all expectations. The reason for the notable enhancement of the photosensitivity by the addition of the acid is not known definitely. One logical explanation may be that the acid-containing resin composition converted itself into a quaternized structure as represented by the general formula:

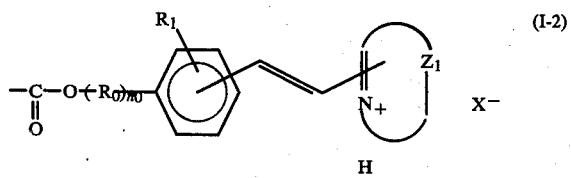

(wherein, $R_0$, $R_1$, $Z_1$ and $n_0$ have the same meanings as described above and $X^-$ denotes an organic acid or inorganic acid residue) and consequently acquired enhanced photosensitivity.

Typical examples of acids which can advantageously be used for the composition of the present invention are inorganic acids such as hydrochloric acid, perchloric acid, phosphoric acid, sulfuric acid, and nitric acid and organic acids such as acetic acid, chloroacetic acid, lactic acid, tartaric acid, benzoic acid, nitrobenzoic acid, benzensulfonic acid, naphthalenesulfonic acid, p-toluenesulfonic acid, and methanesulfonic acid. These acids may be used either independently or in various desired combinations of two or more. When the resin is soluble in water and water is used as the solvent therefor, it makes no difference whether there is used an inorganic acid or organic acid. When there is used an organic solvent, however, it is more advantageous to use an organic acid than otherwise. The kind and the amount of the acid to be added depend on the aforementioned basicity of the heterocyclic ring of the photocrosslinking residue. In the case of strong basicity (pKa=5.23) such as of pyridine ring, for example, a strong acid can be used advantageously and the amount of this strong acid may be sufficient in the neighborhood of 1 mole per mole of the residue. If a weak acid is used instead, the amount of this weak acid is required to be 2 to 5 moles.

When the photosensitive resin in the composition of the present invention is exposed to light, the two photocrosslinking residues undergo a dimerization reaction to form a cyclobutane ring and give rise to a bridge between the linear chains of the high molecular compound and insolubilize the composition in solvents.

The film which contains the resin crosslinked and insolubilized by exposure to light is generally developed in a solvent for photosensitive resin. The portion of the resin which has not been exposed to light is dissolved out, leaving behind a picture image in the film. In this case, the development is obtained more readily when a basic substance is incorporated in the developing solvent. Alternatively, the photosensitive film exposed to light may be immersed in a solvent which is incapable of dissolving the resin and which has incorporated therein a basic substance, before the film is developed with a solvent which is capable of dissolving the resin.

Examples of basic substances to be added to the solvent to be used in the development are inorganic substances such as sodium hydroxide, potassium hydroxide, lithium hydroxide, sodium bicarbonate, sodium carbonate, and ammonia and organic basic substances such as pyridine, triethylamine, dimethylamine, and diethylamine. Examples of the weakly basic substances are N,N-dimethylformamide, formamide, N,N-dimethylacetamide, N-methylpyrrolidone, N,N,N',N'-tetramethylurea, and dimethylsulfoxide. In many cases, methanol, ethanol, methoxy ethanol, ethoxy ethanol, acetone, tetrahydrofuran, dioxane, and water, which are not basic, also prove to be effective. They may well be included among basic substances in the sense considered herein. Such a weakly basic substance or water is advantageously used where the heterocyclic ring of the photosensitive group has weak basicity.

Now, the photosensitive high molecular compound which contains in the side chain thereof an aromatic quaternized nitrogen-containing heterocyclic residue represented by the general formula (II) will be described below. First, the method for the production of this compound will be described.

The high molecular compound containing in the side chain thereof a formylphenyl group represented by the general formula (III) which is used in the first method of manufacture is easily produced by a method which comprises causing a hydroxybenzaldehyde to react with a copolymer possessing an active halogen as described in H. W. Gifson and F. C. Bailey, J. Poly. Sci., Poly. Chem. Ed., 12, 2141 (1975) or by a method which comprises adding a benzaldehyde derivative possessing a carboxyl group such as formyl benzoic acid to a copolymer of glycidyl methacrylate. It can otherwise be produced by preparing a vinyl monomer containing a formyl phenyl group in advance and subjecting this vinyl monomer to copolymerization with other vinyl monomer. Examples of vinyl monomers containing formyl phenyl group are as follows.

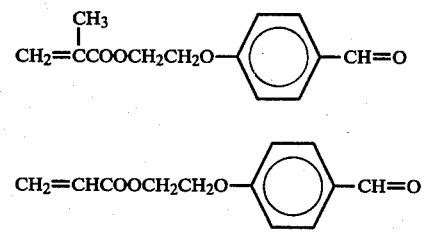

-continued

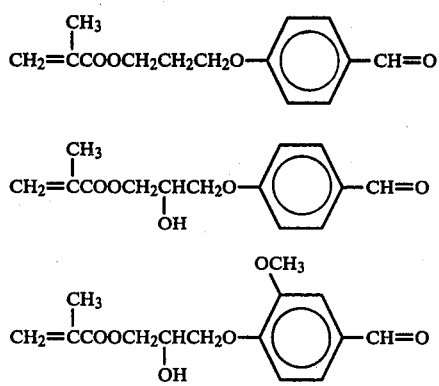

The high molecular compound containing a formyl phenyl group may be obtained by copolymerizing a vinyl monomer containing a formyl phenyl group described above with other vinyl comonomer copolymerizable thereof. This vinyl comonomer is not limited in any sense except for the condition that it be copolymerizable with the vinyl monomer. Examples of comonomers usable herein are acrylonitrile, methyl acrylate, ethyl acrylate, butyl acrylate, methyl methacrylate, ethyl methacrylate, 2-hydroxyethyl methacrylate, N,N-dimethylmethacrylamide, acrylamide, N-vinylpyrrolidone, styrene, 1,3-butadiene, and 2-vinylpyridine. These vinyl comonomers may be used either independently or in various desired combinations of two or more members. In producing the photo-insolubilized high molecular compound useful as a photosensitive material by the reaction of the vinyl monomer containing a formyl phenyl group with the compound of the general formula (IV), this vinyl monomer unit is desired to be used in an amount falling in the range of 0.2 to 10 mol% based on the total amount of all the vinyl monomers used.

Examples of methyl-substituted quaternized nitrogen-containing heterocyclic compounds represented by the general formula (IV) are 1,2-dimethylpyridinium, 1,4-dimethylpyridinium, 1-ethyl-4-methylpyridinium, 1,2-dimethylquinolinium, 1,4-dimethylquinolinium, 1,2-dimethylisoquinolinium, 2,3-dimethylthiazolium, 2,3-dimethylbenzthiazolium, 2,3-dimethylbenzoxazolium, and 1,2-dimethylpyrimidinium. These compounds are used in the form of salts such as halogenides, benzene sulfonates, toluene sulfonates, methyl sulfates, and perchlorates.

The formylphenyl group-containing high molecular compound represented by the general formula (III) and the quaternized heterocyclic compound represented by the general formula (IV) are easily subjected in the form of their solutions to dehydration condensation to produce the photosensitive high molecular compound of the general formula (II). Since the compound represented by the general formula (IV) is insoluble in a non-polar solvent, the two compounds mentioned above are desired to be dissolved homogeneously in a polar solvent such as, for example, methanol, ethanol, 2-propanol, acetonitrile, N,N-dimethylformamide, N,N-dimethylacetamide, or N-methylpyrrolidone, or in a mixed solvent consisting of such a polar solvent and other solvent and, in a homogeneous state, subjected to the reaction. To accelerate this reaction, the reaction system may incorporate therein an aliphatic amine or other similar carboxylic acid salt. For further smooth progress of the reaction, the heterocyclic compound represented by the general formula (IV) is desired to be used in an excess amount of more than 1 mole up to 10 moles per mole of formyl groups. The reaction temperature is in the range of from room temperature to 100° C., preferably from 30° to 70° C. The reaction time is generally in the range of from 1 to 40 hours, although it is variable with the kinds of particular reactants involved and the reaction temperature.

The structural unit represented by the general formula (V) which is used in the aforementioned second method is an unquaternized form of the structural unit represented by the general formula (II). Examples of the nitrogen-containing heterocyclic ring in the structural unit are pyridine, quinoline, isoquinoline, thiazole, isothiazole, benzothiazole, oxazole, isoxazole, pyrimidine, pyridazine, and pyrazine. These rings may have undergone substitution with an alkyl group, alkoxyl group, or hydroxyl group. Examples of structural units represented by the general formula (V) are as follows.

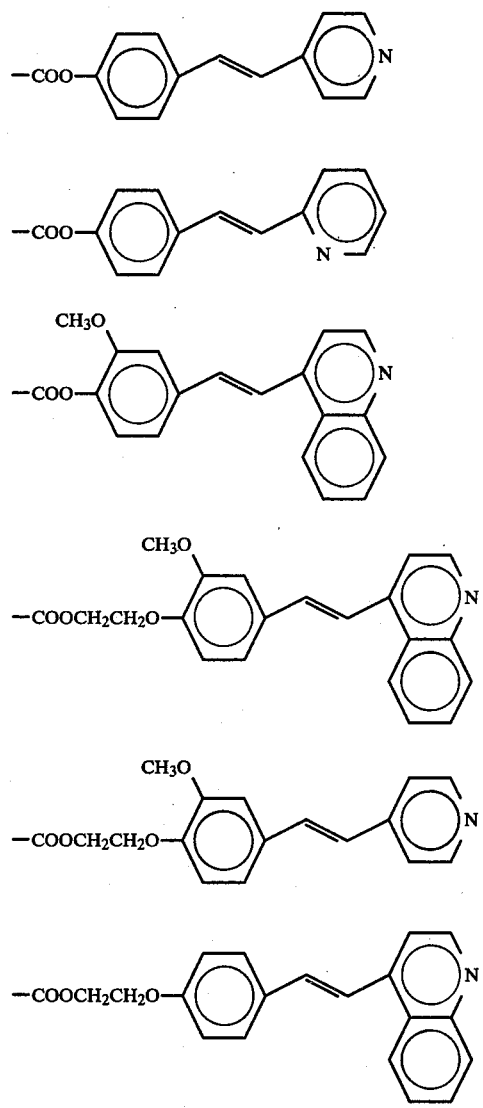

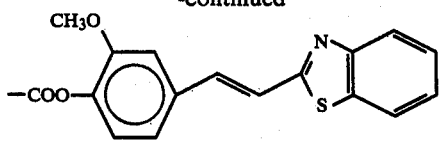

The high molecular compound containing such a structural unit as mentioned above may be produced by copolymerizing an acrylate or methacrylate derivative of the structural unit with other vinyl monomer copolymerizable therewith. In this case, it is advantageous from the practical point of view to use the acrylate or methacrylate derivative containing the aforementioned structural unit in an amount of 0.2 to 10 mol% based on the other vinyl monomer.

Examples of alkylating or aralkylating agents to be used for quaternizing the high molecular compound containing the aforementioned structural unit in the side chain thereof obtained by the copolymerization as described above are methyl chloride, methyl bromide, methyl iodide, dimethyl sulfate, diethyl sulfate, methyl p-toluenesulfonate, and benzyl chloride.

The reaction for the quaternization is easily carried out by dissolving the high molecular copolymer possessing the side chain represented by the general formula (V) in an organic solvent, adding to the resultant solution a compound represented by the general formula (VI) as an alkylating agent, and keeping the resultant reaction system at a temperature in the range of from room temperature to 100° C., preferably from 30° to 70° C. for a period of 1 to 40 hours. This reaction produces the high molecular compound containing in the side chain thereof a group represented by the general formula (II). The ratio of the compound represented by the general formula (VI) to the structural unit represented by the general formula (V) is desired to fall in the range of 1:1 to 1:10.

According to the third method, the product aimed at is obtained by copolymerizing the acrylic acid or methacrylic acid derivative monomer represented by the general formula (VII) with a comonomer or other polymeric vinyl compound.

Examples of compounds represented by the general formula (VII) are as shown below. Other compounds not included among the examples are also usable so far as they satisfy this general formula (VII).

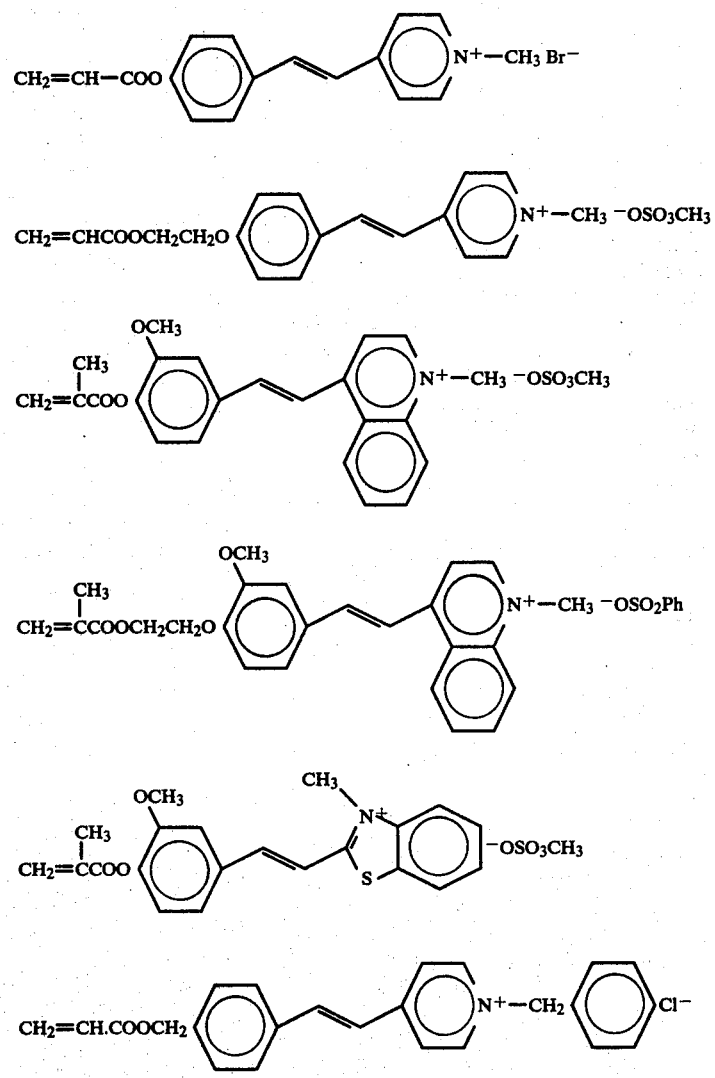

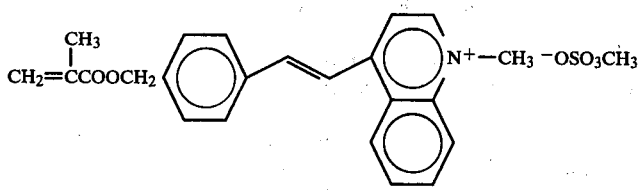

The compounds of the general formula (VII) are produced by alkylating a corresponding free base.

The comonomer to be copolymerized with the monomer represented by the general formula (VII) is not particularly limited except for the condition that it should be copolymerizable with the monomer. Examples of comonomers advantageously usable for the copolymerization are acrylonitrile, methacrylonitrile, acrylamide, methacrylamide, N,N-dimethylacrylamide, methyl acrylate, ethyl acrylate, butyl acrylate, hexyl acrylate, methyl methacrylate, ethyl methacrylate, butyl methacrylate, 2-ethylhexyl methacrylate, 2-hydroxyethyl methacrylate, and 2-hydroxypropyl methacrylate. These comonomers may be used either independently or in various desired combinations of two or more members.

The compounds of the general formula (VII) possessing a quaternized structure are soluble in a polar solvent. By solution polymerization in such a solvent, therefore, these compounds readily produce a copolymer. The polymerization generally proceeds advantageously when it is carried out in the form of radical polymerization. The reaction product obtained by this polymerization can be readily refined and isolated by reprecipitation in a poor solvent.

The high molecular compounds containing in the side chain thereof a group represented by the general formula (II) to be produced by the aforementioned method have a vinyl polymer as their backbone. The monomer represented by the general formula (VII) incorporating therein the residue represented by the general formula (II) or the monomer incorporating therein the residue represented by the general formula (III) or (V) as a precursor is desired to be contained in the copolymer in an amount falling in the range of 0.2 to 10 mol%. If the amount of the residue or photosensitive structural unit represented by the general formula (II) to be incorporated into the copolymer is less than 0.2 mol%, the time of the irradiation of light required for insolubilization is notably prolonged or the insolubilized resin acquires amply tolerable strength with difficulty. If this amount exceeds 10 mol%, the copolymer as put to actual use gives a notably high viscosity such as to induce the phenomenon of gelation or degrade maleability. Any deviation from the range mentioned above is undesirable.

The photo-insolubilized composition which comprises a photo-insolubilizable resin containing a photocrosslinking residue represented by the general formula (I) and an acid can be used as a material for printing plates, as a material for photoresist, and further as a basal material for printing inks and paints. Since the composition of this invention is insolubilized with outstanding sensitivity in the zone of long wavelengths, it can be advantageously used as a photosensitive material for laser photography and as a material for enlarged reproduction.

The photosensitive high molecular compound of this invention which contains in the side chain thereof a residue represented by the general formula (II) manifests higher sensitivity than the conventional photosensitive material even though the amount of the photosensitive group incorporated in the side chain is much smaller than in the conventional photosensitive material. The other comonomer to be used in a large amount for copolymerization with the photosensitive high molecular compound of this invention, therefore, enjoys wide selectivity. When the high molecular compound is desired to be hydrophilic, for example, a comonomer of high hydrophilicity may be selected and the produced high molecular compound may be used as dissolved in a hydrophilic solvent. Otherwise, by selecting a hydrophobic vinyl comonomer, there may be obtained a photosensitive high molecular compound which is soluble in a polar solvent. Even when the intended application necessitates use of a hydrophobic vinyl comonomer, the properties of the produced high molecular compound may be controlled by lowering the content of the photosensitive residue of strong polarity so that the compound will become soluble in a solvent of low polarity. By thus selecting the vinyl comonomer for copolymerization and controlling the content of the photosensitive group, it becomes possible to produce a photosensitive high molecular compound suitable for a solvent freely selected from a wide spectrum of solvents ranging from a highly polar solvent like water to a weakly non-polar solvent like benzene.

The photosensitive high molecular compound of the present invention is useful as a photoresist, a material for printing, a vehicle for printing inks, and a basal material for paints. Thus, it constitutes itself a photosensitive resin material of very high economic value.

Now, the present invention will be described more specifically below with reference to working examples.

EXAMPLES 1-4

In 62.9 g of acetic anhydride, 26.73 g of 4-methylquinoline and 31.25 g of vanillin were refluxed overnight. The resultant reaction mixture was treated with an alkali. The product thus obtained was recrystallized via butyl cellosolve, to afford 29 g of 4-[2-(4-hydroxy-3-methoxyphenyl)-ethenyl]-quinoline having a melting point of 217°–219° C. From 0.55 g of this product, 1.75 g of triethylamine, 1.66 g of methacrylic acid chloride, and 16 cm³ of N,N-dimethylacetamide, there was obtained 4.70 g (80.3% in yield) of 4[2-(4-methacroyloxy-3-methoxyphenyl)-ethenyl]-quinoline having a melting point of 134°–135° C. This product was recrystallized via ethyl acetate and assayed by infrared absorption spectrometry and elementary analysis for its chemical structure.

The quinoline derivative thus obtained was copolymerized with methyl methacrylate (MMA) under differing sets of conditions shown in Table 1. The resultant copolymerization solution was added to methanol to educe and separate a resin. All the resins produced invariably showed maximum absorption at 335 nm.

TABLE 1

| Sample resin | Monomers (g) | | Benzene (cm³) | AIBN* (mg) | Yield (%) | Molecular weight MW |
|---|---|---|---|---|---|---|
| | Quinoline derivative | MMA | | | | |
| 1 | 1.03 | 2.94 | 12 | 15 | 90.2 | 8 × 10⁴ |
| 2 | 0.518 | 2.85 | 12 | 15 | 89.7 | 11 × 10⁴ |
| 3 | 1.03 | 2.94 | 3 | 15 | 98.0 | 20 × 10⁴ |
| 4 | 0.518 | 2.85 | 3 | 15 | 88.7 | 21 × 10⁴ |

*AIBN: Azobis-isobutylonitrile as polymerization initiator

The copolymer of 4-[2-(4-methacryloyloxy-3-methoxyphenyl)-ethenyl]-quinoline and MMA obtained as described above was dissolved in 1,2-dichloroethane, applied with a spinner to an aluminum plate, and tested for photosensitivity by the Gray Scale Method using a xenon lamp as a light source. The sensitivity measured by using 1,2-dichloroethane as a developing agent is indicated in Table 2, relative to that of commercially available TPR (made by Tokyo Oka).

In the experiment, each of the resins was dissolved in 1,2-dichloroethane and mixed with a different amount of p-toluenesulfonic acid (1 to 10 moles) per mole of the photo-crosslinking residue in the resin. The resultant solution was tested for photosensitivity by following the procedure described above. The results are shown in Table 2.

TABLE 2

| Example | Sample resin | Ratio of incorporation of photo-crosslinking residue (mol %) | Relative sensitivity Amount of p-toluenesulfonic acid added (moles/mole) | | | | |
|---|---|---|---|---|---|---|---|
| | | | 0 | 1 | 2 | 4 | 10 |
| 1 | 1 | 2 | 2.0 | — | 8.0 | — | — |
| 2 | 2 | 5 | 0.6 | — | 2.5 | — | — |
| 3 | 3 | 2 | 2.5 | — | 10.0 | — | — |
| 4 | 4 | 5 | 0.7 | 2.0 | 2.8 | 2.8 | 2.0 |

It is noted from this table that the addition of p-toluenesulfonic acid notably improved the photosensitivity of the resin itself. Substantially the same results were obtained by using benzenesulfonic acid, naphthalenesulfonic acid, or methanesulfonic acid in the place of p-toluenesulfonic acid. The sensitivity was rather higher when the ratio of incorporation of photo-crosslinking residue was lower (2 mol%).

EXAMPLE 5

By the reaction of 20.0 g of γ-picolin and 26.2 g of p-hydroxybenzaldehyde in 65.8 g of acetic anhydride, there was obtained 4-[2-(4-hydroxyphenyl)-ethenyl]-pyridine. In 10 cm³ of N,N-dimethylacetamide, 2 g of the reaction product was dissolved and 1.23 g of triethylamine was further added thereto. This mixture was ice cooled and 1.34 g of methacrylic acid chloride was dropwise added thereto. After the reaction was completed, water was added to deposit crystals, which were separated by filtration. The separated crystals were recrystallized via a mixed solvent of ethyl acetate and hexane, to afford 2.16 g (80% in yield) of 4-[2-(4-methacryloyloxyphenyl)-ethenyl]-pyridine. The melting point of the crystals was 156° to 158° C.

To 3 cm³ of benzene, 398 mg of the produced pyridine derivative and 2.85 g of MMA were added and then 15 mg of AIBN was added. In an evacuated sealed tube, the mixture was heated to 60° C. to induce polymerization. After the reaction was completed, the product was poured into methanol to deposit and isolate a resin. The molecular weight of the resin was $6.1 \times 10^4$.

The photosensitivity of this resin was only about 1/20 of that of the aforementioned commercially available TPR. When this resin in the form of a thin film was held in an atmosphere of hydrogen chloride gas, the photosensitivity was improved to 0.8 times that of TPR. A photosensitive composition obtained by dissolving this resin in 1,2-dichloroethane and adding to the resultant solution p-toluenesulfonic acid in an equal mole relative to the photo-crosslinking residue showed substantially the same degree of sensitivity as the TPR.

EXAMPLE 6

By following the procedure of Example 1, 2-[2-(3-methoxy-4-hydroxy)-ethenyl]-benzothiazole of a melting point of 137°–138.5° C. was obtained from 9.77 g of 2-methylbenzothiazole, 9.97 g of vanilin, and 16.72 g of acetic anhydride. When this product was methacryloylated by following the procedure of Example 1, 2-[2-(3-methoxy-4-methacryloyloxy)-ethenyl]-benzothiazole was obtained in a yield of 80%. The chemical structure of this compound was identified by infrared absorption spectroscopy and elementary analysis.

In 1.5 g of benzene, 125.5 mg of the resultant polymerizable benzothiazole derivative and 1.00 g of MMA plus 5 mg of AIBN as a catalyst were polymerized in an evacuated sealed tube at a temperature of 60° C. After the polymerization was completed, the content of the tube was poured into methanol to precipitate a resin. The precipitated resin was separated and dried. This resin showed a maximum absorption in chloroform at 348 nm.

When the resin was tested for sensitivity in the same way as in Examples 1–4, the sensitivity was twice that of the TPR. A composition obtained by dissolving the resin in chloroform and mixing the solution with p-toluenesulfonic aicd of an amount of 2 moles per mole of the photo-crosslinking residue in the resin showed sensitivity about 10 times the sensitivity of the TPR.

EXAMPLES 7–8

In 61.34 g of acetic anhydride, 34.40 g of 2-methylquinoline and 36.57 g of vanilin were allowed to react with each other under reflux for 16 hours, and 50 cm³ of acetic acid was expelled by distillation. The residue and 250 cm³ of 3 N hydrochloric acid added thereto were heated for one hour. The heated mixture was cooled to deposit crystals, which were separated by filtration. The crystals were suspended in aqueous ammonia and stirred for one hour to expel hydrogen chloride from the crystals. The crystals thus freed from hydrogen chloride were again separated by filtration and collected. They were recrystallized via 2-ethoxyethanol to afford 2-[2-(4-hydroxy-3-methoxyphenyl)-ethenyl]-quinoline in a yield of 63%.

In 5 cm³ of N,N-dimethylacetamide, 2.77 g of the produced quinoline derivative was dissolved and 1.42 g of glycidyl methacrylate and 0.10 g of tetrabutylammonium chloride were added thereto. The resultant mixture was reacted by maintaining it at 90° to 100° C. for 5 hours. The reaction product was mixed with water. The oily substance separated consequently was extracted via ethyl acetate, washed thoroughly with water, and dried. The dry product was distilled to expel the solvent and then separated and purified by silica gel chromatography, to afford 2-{2-[3-methoxy-4-(2- hydroxy-3-methacryloyloxypropyloxy)-phenyl]-ethenyl}-quinoline in a yield of 50%. When this product was recrystallized via ethyl acetatehexane, there was obtained a pure product having a melting point of 119° C. It was identified by elementary analysis and infrared absorption spectrometry.

By copolymerizing this high-purity quinoline derivative with MMA, there was obtained a photosensitive resin having a maximum absorption at 359 nm. The conditions under which two resins were produced from varying amounts of quinoline derivative and MMA are shown in Table 3. The relative sensitivity obtained relative to the sensitivity of TPR of each of the resins mentioned above and of a composition obtained by adding to each of the resins p-toluenesulfonic acid of an amount of 2 moles per mole of the photo-crosslinking residue in the resin are collectively shown in Table 4. The compositions incorporating the acid were developed with 1,2-dichloroethane containing a small amount of dimethyl formamide.

TABLE 3

| Sample resin | Monomers (g) Quinoline derivative | MMA | AIBN (mg) | Yield (%) | Molecular weight $M_W$ | $M_n$ |
|---|---|---|---|---|---|---|
| 7 | 0.233 | 2.94 | 15 | 90.2 | $27 \times 10^4$ | $13 \times 10^4$ |
| 8 | 0.582 | 2.85 | 15 | 91.3 | $24 \times 10^4$ | $13 \times 10^4$ |

In the polymerization, 3 cm$^3$ of benzene was used as a catalyst.

TABLE 4

| Example | Sample resin | Ratio of incorporation of photo-crosslinking residue (mol %) | Relative sensitivity No acid | Acid added |
|---|---|---|---|---|
| 7 | 7 | 2 | 0.1 | 4.3 |
| 8 | 8 | 5 | 1.1 | 10.0 |

It is noted from the tables that in the case of the quinoline derivative-MMA copolymer incorporating 2 mol% of the photo-crosslinking residue showed lower sensitivity than the TPR when it contained no acid, whereas the composition obtained by adding to the same copolymer p-toluenesulfonic acid in an amount of 2 moles per mole of the photo-crosslinking residue showed sensitivity four times the sensitivity of the TPR. In the case of the copolymer incorporating 5 mol% of the photo-crosslinking residue showed sensitivity substantially equal to the sensitivity of the commercially available material even though the ratio of the incorporation of the photo-crosslinking residue was far smaller than the commercially available material. When the acid was added, the sensitivity increased to 10 times the sensitivity exhibited in the absence of the acid. Substantially the same results were obtained by using methanesulfonic acid or benzenesulfonic acid was used instead of p-toluenesulfonic acid.

When the aforementioned sample resin incorporating therein 5 mol% of the photo-crosslinking residue was mixed with acetic acid of an amount of 10 moles per mole of the photo-crosslinking residue and the resultant composition was applied to an aluminum plate with a spinner, the resultant film showed sensitivity 6 times the sensitivity of the TPR.

EXAMPLE 9

In 1 g of benzene, 77.6 mg of 2-{2-[3-methoxy-4-(2-hydroxy-3-methacryloyloxypropyloxy)-phenyl]-ethenyl}-quinoline used in Example 7 was polymerized in combination with 390 mg of methyl methacrylate and 750 mg of n-butyl methacrylate, with 5 mg of AIBN used as a polymerization initiator. The polymerization was carried out by keeping the aforementioned mixture in an evacuated sealed tube at a temperature of 60° to 65° C. for 20 hours. After the polymerization was completed, the tube was shaken to swril its content. Then, the content was poured into methanol to precipitate a resin. The resin was then isolated.

This resin showed only 1/20 of the sensitivity of the TPR. When this resin was exposed to an atmosphere of hydrogen chloride gas, it acquired sensitivity about three times the sensitivity of the TPR. When the resin was exposed to an atmosphere of acetic acid, it acquired sensitivity substantially the same as the sensitivity of the TPR. When a film of this resin was immersed in a methanol solution of 1% lactic acid, washed with methanol, and tested for sensitivity, it showed sensitivity about three times that of the TPR.

EXAMPLES 10-11

Two terpolymers of different composition were prepared by copolymerizing 2-{2-[3-methoxy-4-(2-hydroxy-3-methacryloyloxy-propyloxy)-phenyl]-ethenyl}-quionoline in combination with MMA and acrylonitrile (AN) in amounts indicated in the table 5. The polymerization invariably used 1.5 g of benzene as a reaction medium and 2.5 mg of AIBN.

The resins thus produced and the compositions obtained by adding to these resins p-toluenesulfonic acid in an amount of 2 moles per mole of the photo-crosslinking residue of the resin were tested for sensitivity relative to the sensitivity of TPR. The results were as shown in Table 5.

TABLE 5

| Example | Monomer composition (mg) MMA | AN | Quinoline derivative | Yield (%) | Ratio of incorporation of photo-crosslinking residue (mol %) | Relative sensitivity No acid | Acid added | Molecular weight ($M_W$) |
|---|---|---|---|---|---|---|---|---|
| 10 | 250 | 130 | 32.8 | 51.3 | 2 | 6 | about 60 | $18 \times 10^4$ |
| 11 | 390 | 50 | 38.8 | 62.5 | 2 | 6 | about 60 | $21 \times 10^4$ |

Although these resins showed satisfactory relative sensitivity (6 times) without addition of any acid, they acquired greatly increased sensitivity of about 60 times the sensitivity of the TPR after addition of the acid.

EXAMPLES 12-14

In benzene, 38.8 mg of 2-{2-[3-methoxy-4-(2-hydroxy-3-methacryloyloxypropyloxy)-phenyl]- ethenyl}-quinoline, 790 mg of methyl methacrylate, and differing amounts of different acrylic monomers indicated in Table 6 were subjected to radical polymerization for 4 hours, to afford a terpolymer as shown in Table 6. The amount of the acrylic monomer was adjusted so that the photosensitive group content would reach 1 mol%. The produced resin was mixed with p-toluenesulfonic acid of an amount of 2 moles per mole of the photo-crosslinking residue of the resin, and the composition so produced was tested for sensitivity relative to the TPR. The results are also shown in Table 6.

TABLE 6

| Example | Kind of acrylic monomer and weight | | Yield | Relative sensitivity |
|---|---|---|---|---|
| 12 | Methyl acrylate | 170 mg | 45.1 | 6 |
| 13 | Ethyl acrylate | 200 mg | 38.9 | 7 |
| 14 | Acrylonitrile | 100 mg | 34.5 | 10 |

EXAMPLE 15

In 10 g of purified benzene, 9.8 g of methyl methacrylate and 0.59 g of 3-methoxy-4-(2-hydroxy-3-methacryloyloxypropyloxy)-benzaldehyde were dissolved and 50 mg of azobisisobutyronitrile (AIBN) was added thereto. The resultant mixture, as held in an evacuated sealed tube, heated at 60° C. for 10 hours to effect a reaction. The reaction solution was diluted with benzene and poured into methanol for reprecipitation. By isolating the precipitate, there was obtained 10.25 g of a copolymer. This copolymer contained 2 mol% of a vinyl unit containing a formyl group.

In 9 g of N,N-dimethylacetamide, 1 g of the copolymer was dissolved and 99.8 mg of 1,2-dimethylpyridinium-p-toluenesulfonate was added. The resultant mixture was stirred in the presence of 50 mg of piperidine at 65° C. for 20 hours to effect a reaction. By reprecipitating the reaction produce in methanol, there was obtained 920 mg of a photosensitive high molecular compound. This compound possessed a maximum absorption in dichloroethane at 355 nm.

A thin film of this high molecular compound was exposed through a step tablet to light and tested for sensitivity. It showed sensitivity about three times the sensitivity of a commercially available polyvinyl cinnammate type photosensitive resin TPR (made by Tokyo Oka). The ratio of incorporation of the photosensitive group in this compound, as calculated from the absorption coefficient, was 0.76 mol%. The molecular weight of this high molecular compound was $M_W=16.7\times10^4$ or $M_n=5.2\times10^4$.

EXAMPLE 16

In 9 g of N,N-dimethylacetamide, 1.00 g of the formyl group-containing methyl methacrylate copolymer prepared in Example 15 was dissolved and 211 mg of 1,4-dimethylpyridinium methosulfate was added and 50 mg of piperidine was further added. The resultant mixture was stirred at 60° C. for 10 hours to effect a reaction. The reaction mixture consequently obtained was immediately applied to an aluminum plate. The applied layer was exposed through an image film to the light from a xenon lamp and then developed with dichloroethane. There was obtained a clear negative image.

EXAMPLE 17

The procedure of Example 16 was repeated, except that 1,4-dimethylquinolinium methosulfate was used in the place of 1,4-dimethylpyridinium methosulfate and the reaction was carried out at 40° C. for 2 hours. The film produced by similarly treating the resultant reaction mixture produced a clear negative image when it was exposed to light and developed similarly.

EXAMPLE 18

In an evacuated sealed tube, 4.9 g of ethyl acrylate and 300 mg of 3-methoxy-4-(2-hydroxy-3-methacryloyloxypropyloxy)-benzaldehyde were polymerized in the presence of 25 mg of AIBN for 10 hours, with 15 g of benzene used as a reaction medium. The reaction mixture was reprecipitated in methanol to produce a refined resin. In 4.5 g of N,N-dimethylacetamide, 500 mg of the resin was dissolved and stirred with 291 mg of 1,2-dimethylpyridinium-p-toluenesulfonate and 30 mg of piperidine at 40° C. to effect a reaction.

In the course of the reaction, the reaction liquid was sampled at intervals. The photosensitive high molecular compound formed at a varying stage of the reaction was tested for sensitivity with a step tablet. The results are shown in relative sensitivity based on the sensitivity of the TPR in Table 7.

TABLE 7

| Reaction time | Relative sensitivity |
|---|---|
| 1 | 0.34 |
| 1.5 | 0.50 |
| 2 | 1.4 |
| 2.5 | 2.0 |
| 3 | 3.0 |
| 3.5 | 6.0 |

EXAMPLE 19

The procedure of Example 18 was repeated, except that 11.3 mg of 1,4-dimethylpyridinium-p-toluenesulfate was used in the place of 1,2-dimethylpyridinium-p-toluenesulfate and the reaction was carried out for 4 hours. The photosensitivity of the reaction mixture consequently obtained was about 3 times that of the TPR.

EXAMPLE 20

In 5 cm³ of dimethyl acetamide, 2.77 g of 2-[2-(4-hydroxy-3-methoxyphenyl)-ethenyl]-quinoline obtained as in Example 7–8 was dissolved and 1.42 g of glycidyl methacrylate and 0.10 g of tetrabutyl ammonium chloride were added thereto. The resultant mixture was heated at 90° to 100° C. for five hours to effect a reaction. The reaction product was mixed with water. The oily substance which consequently separated in the reaction product was extracted with ethyl acetate, washed thoroughly with water, and then dried. The dried product was distilled to expel the solvent and then refined by silica gel chromatography to produce 2-{2-[3-methoxy-4-(2-hydroxy-3-methacryloyloxypropyloxy)-phenyl]-ethenyl}-quinoline in a yield of 50%. This compound was recrystallized via a mixed solvent of ethyl acetate and hexane to isolate a pure product having a melting point of 119° C. The product was identified by means of elementary analysis and infrared absorption spectrometry.

In 3 ml of benzene as a medium, 0.58 g of the quinoline derivative possessing a polymerizing property and 2.85 g of methyl methacrylate were polymerized at 60° C. in the presence of 15 mg of AIBN. This reaction was carried out in an evacuated sealed tube. The reaction product was poured into a large amount of methanol to deposit the polymer, which was separated and dried. The polymer was obtained in a yield of 91.3%.

In 5 g of 1,2-dichloroethane, 500 mg of the resin so produced was dissolved and 120 mg of dimethyl sulfate was added thereto. The resultant mixture was heated at 60° C. for 30 hours to effect a reaction. The reaction product was analyzed by ultraviolet absorption to confirm that it had undergone quaternization. Then, the reaction product was poured into hexane to deposit the product, which was thoroughly washed with hexane and vacuum dried. The polymer consequently produced showed maximum absorption at 420 nm.

This polymer was dissolved in 1,2-dichloroethane containing a small amount of 2-methoxyethyl alcohol and the resin solution was uniformly applied to an aluminum plate. The applied layer of polymer was exposed to the light from a xenon lamp and tested for sensitivity by the Gray Scale Method. The sensitivity was found to be six times that of the TPR.

EXAMPLE 21

By following the procedure of Example 1, 77.6 mg of 2-{2-[3-methoxy-4-(2-hydroxy-3-methacryloyloxy-propyloxy)-phenyl]-ethenyl}-quinoline obtained in Example 15, 740 mg of methyl methacrylate, and 310 mg of butyl methacrylate were subjected to radical polymerization, to afford a terpolymer resin. In 2 g of 1,2-dichloroethane, 200 mg of the resin was dissolved and 20 mg of dimethyl sulfate was added thereto. The resultant mixture was subjected to the same reaction as carried out in Example 15. The reaction product was reprecipitated in hexane to isolate a pure product. This product was dissolved in 1,2-dichloroethane and the solution was applied to an aluminum plate and tested for sensitivity. The sensitivity of the applied layer was about three times that of the TPR. This resin was confirmed to be insolubilized by light of wavelengths up to about 520 nm.

EXAMPLE 22

In 65.8 g of acetic anhydride, 20.0 g of γ-picolin and 26.2 g of p-hydroxybenzaldehyde were refluxed for 24 hours. The resultant reaction mixture and 100 ml of 6 N hydrochloric acid added thereto were further refluxed for 60 minutes and then cooled. The reaction product was neutralized by addition of aqueous ammonia and stirred for 1 hour. The yellow crystals which consequently deposited therein were separated by filtration. The crystals were recrystallized from a mixed solvent of ethanol and ether, to afford 35 g of 4-[2-(4-hydroxy-phenyl)-ethenyl]-pyridine having a melting point of 272° to 275° C.

In 10 ml of N,N-dimethylacetamide, 2 g of the crystals were dissolved and 1.23 g of triethylamine was added thereto. The resultant mixture was cooled and, in the meantime, 1.34 g of methacrylic acid chloride was added thereto dropwise. After the reaction was completed, water was added to the reaction mixture to deposit crystals. The crystals were separated by filtration. By recrystallizing the crystals via a mixed solvent of ethyl acetate and hexane, there were obtained 2.16 g of 4-[2-(4-methacroyloxyphenyl)-ethenyl]-pyridine crystals having a melting point of 156° to 158° C. in a yield of 80%.

The chemical structure of this compound was confirmed by means of infrared absorption spectrometry and elementary analysis.

In 3 ml of benzene, 398 mg of the pyridine derivative obtained above and 2.85 g of methyl methacrylate were dissolved and subjected to polymerization in the presence of 15 mg of AIBN at 60° C. The reaction product was poured into methanol to deposit a resin component. Consequently, a copolymer was obtained in a yield of 98.4%. The photosensitivity of the copolymer was about 1/20 of that of the TPR.

In 5 g of 1,2-dichloroethane 500 mg of the resin was dissolved and 120 mg of dimethyl sulfate was added thereto. The resultant mixture was subjected to a reaction at 60° C. for 20 hours. The reaction product was reprecipitated in hexane. The precipitate was separated and dissolved again in 1,2-dichloroethane. The resultant solution was applied to an aluminum plate and dried. The dried layer of the resin solution was tested for photosensitivity. The sensitivity was about the same as that of the TPR.

EXAMPLE 23

In 1.5 g of benzene, 125.5 mg of the 2-[2-(3-methoxy-4-methacryloyloxy)ethenyl]-thiazole obtained as in Example 6 and 1.00 g of methyl methacrylate were dissolved. The solution was polymerized in the presence of AIBN at 60° C. in an evacuated sealed tube. The polymer obtained was reprecipitated in methanol, and the precipitate was separated and dried. The copolymer thus obtained showed a maximum absorption in chloroform at 348 nm.

When this copolymer was tested for sensitivity, it showed sensitivity 2.0 times the sensitivity of the TPR.

When 500 mg of the copolymer obtained above was quaternized in the same manner as in Example 22, there was obtained a resin which showed a maximum absorption at 390 nm. This resin showed sensitivity about 9 times the sensitivity of the TPR.

EXAMPLE 24

In 3 ml of ethyl acetate, 100 mg of 2-{2-[3-methoxy-4-(2-hydroxy-3-methacryloxypropyloxy)-phenyl]-ethenyl}-quinoline obtained in Examples 7-8 was dissolved and 50 mg of dimethyl sulfate was added thereto. The resultant mixture was subjected to a reaction at 60° C. for 5 hours. The crystals of an orange color deposited in the reaction mixture were separated by filtration, washed with ethyl acetate, and thereafter vacuum dried at 50° C. Thus, a quaternized salt was obtained in a yield of 81%. This compound showed a maximum absorption in methanol at 424 nm and an extinction coefficient of $2.2 \times 10^4$.

In 1 ml of N,N-dimethylacetamide, 50 mg of the quaternized salt obtained above and 500 mg of N,N-dimethylacrylamide were subjected to polymerization in the presence of 2 mg of AIBN.

The copolymerization solution thus obtained was applied, in its unmodified form, to an aluminum plate with a spinner and dried with warm air to produce a thin film. When the film was exposed to light and then developed with water, it showed sensitivity 7 times the sensitivity of the TPR.

What is claimed is:

1. A photo-insolubilizable composition, comprising a photo-insolubilizable resin containing at least 0.2 mol% of a nitrogen-containing heterocyclic residue represented by the general formula:

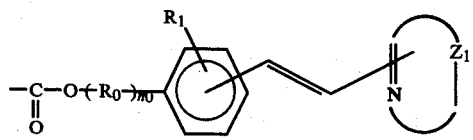

wherein, $n_0$ is 0 or 1, $R_0$ denotes a divalent organic residue, $R_1$ denotes one member selected from the class consisting of a hydrogen atom and an alkoxy group and $Z_1$ denotes an atomic group forming an aromatic heterocyclic ring and 0.5 to 10 moles, per mole of said residue of said resin, of at least one member selected from the group consisting of organic acids and inorganic acids.

2. A photo-insolubilizable composition according to claim 1, wherein the organic acids are acetic acid, chloroacetic acid, lactic acid, tartaric acid, benzoic acid, nitrobenzoic acid, benzenesulfonic acid, naphthalenesulfonic acid, p-toluenesulfonic acid, and methanesulfonic acid.

3. A photo-insolubilizable composition according to claim 1, wherein the inorganic acids are hydrochloric acid, perchloric acid, phosphoric acid, sulfuric acid, and nitric acid.

4. A photo-insolubilizable composition according to claim 1, wherein the molecular weight of the photo-insolubilizable resin is in the range of 2,000 to 1,000,000.

* * * * *